(12) United States Patent
Campbell et al.

(10) Patent No.: US 8,194,406 B2
(45) Date of Patent: Jun. 5, 2012

(54) APPARATUS AND METHOD WITH FORCED COOLANT VAPOR MOVEMENT FOR FACILITATING TWO-PHASE COOLING OF AN ELECTRONIC DEVICE

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 288 days.

(21) Appl. No.: 12/565,175

(22) Filed: Sep. 23, 2009

(65) Prior Publication Data

US 2011/0069453 A1 Mar. 24, 2011

(51) Int. Cl.
*H05K 7/20* (2006.01)

(52) U.S. Cl. ........ 361/698; 361/695; 361/699; 361/702; 62/259.2; 165/104.33

(58) Field of Classification Search .......... 361/688–692, 361/694–695, 697–702
See application file for complete search history.

(56) References Cited

U.S. PATENT DOCUMENTS

| | | | |
|---|---|---|---|
| 6,108,201 A * | 8/2000 | Tilton et al. | 361/689 |
| 7,349,213 B2 | 3/2008 | Campbell et al. | |
| 7,391,612 B2 * | 6/2008 | Foster et al. | 361/697 |
| 7,450,385 B1 | 11/2008 | Campbell et al. | |
| 7,477,517 B2 * | 1/2009 | Khanna et al. | 361/704 |
| 7,511,957 B2 * | 3/2009 | Campbell et al. | 361/699 |
| 2003/0172669 A1 * | 9/2003 | Tilton et al. | 62/310 |
| 2007/0183125 A1 * | 8/2007 | Tilton et al. | 361/699 |
| 2007/0295480 A1 * | 12/2007 | Campbell et al. | 165/80.4 |
| 2009/0126909 A1 | 5/2009 | Ellsworth, Jr. et al. | |
| 2010/0154454 A1 * | 6/2010 | Blackstone | 62/259.3 |

OTHER PUBLICATIONS

Hwang, U.P., "Heat Exchanger for Vapor Condensation by Dropwise Technique", IBM Technical Disclosure Bulletin, Publication No. IPCOM000089717D (Dec. 1, 1977).

Hwang et al., "Evaporation Cooling Module", IBM Technical Disclosure Bulletin, Publication No. IPCOM000066472D (Mar. 1, 1979).

(Continued)

*Primary Examiner* — Courtney Smith
(74) *Attorney, Agent, or Firm* — Dennis Jung, Esq.; Kevin P. Radigan, Esq.; Heslin Rothenberg Farley & Mesiti P.C.

(57) ABSTRACT

Apparatus and method are provided for two-phase dielectric cooling of an electronic device. The apparatus includes a coolant flow path, a vapor condenser and one or more vapor fans. The coolant flow path is in fluid communication with the electronic device, where liquid dielectric coolant within the flow path vaporizes upon contacting the electronic device, forming dielectric coolant vapor, and thereby facilitating cooling of the electronic device. The vapor condenser is also in fluid communication with the coolant flow path and facilitates condensate formation from the dielectric coolant vapor. The one or more vapor fans are disposed within the flow path to actively move dielectric coolant vapor into contact with the vapor condenser, and thereby enhance cooling of the electronic device by facilitating coolant condensate formation and thus recirculation of the coolant condensate as liquid dielectric coolant.

20 Claims, 12 Drawing Sheets

OTHER PUBLICATIONS

Oktay et al., "Subcooled Flow Boiling with Flow Pattern Control", IBM Technical Disclosure Bulletin, Publication No. IPCOM000067827D (Oct. 1, 1979).

Chu et al., "Dielectric Fluidized Cooling System", IBM Technical Disclosure Bulletin, Publication No. IPCOM000088682D (Jul. 1, 1977).

Campbell et al., "Condenser Structures with Fin Cavities Facilitating Vapor Condensation Cooling of Coolant", U.S. Appl. No. 12/491,287, filed Jun. 25, 2009.

Campbell et al., "Liquid Cooling Apparatus and Method for Facilitating Cooling of an Electronics System", U.S. Appl. No. 12/168,259, filed Jul. 7, 2008.

Campbell et al., "Apparatus and Method for Facilitating Immersion-Cooling of an Electronic Subsystem", U.S. Appl. No. 12/256,618, filed Oct. 23, 2008.

Campbell et al., "Liquid Cooling Apparatus and Method for Cooling Blades of an Electronic System Chassis", U.S. Appl. No. 12/256,623, filed Oct. 23, 2008.

Campbell et al., "Apparatus and Method for Immersion-Cooling of an Electronic System Utilizing Coolant Jet Impingement and Coolant Wash Flow", U.S. Appl. No. 12/256,631, filed Oct. 23, 2008.

Miyahara, M., "Small Fans for Cooling Small Electronic Devices", Electronics Cooling Magazine, online article retrieved from http://electronics-cooling.com/html/2009_may_techbrief.php (Aug. 31, 2009).

\* cited by examiner

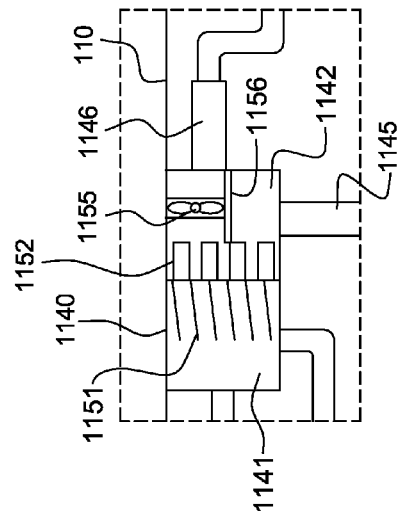
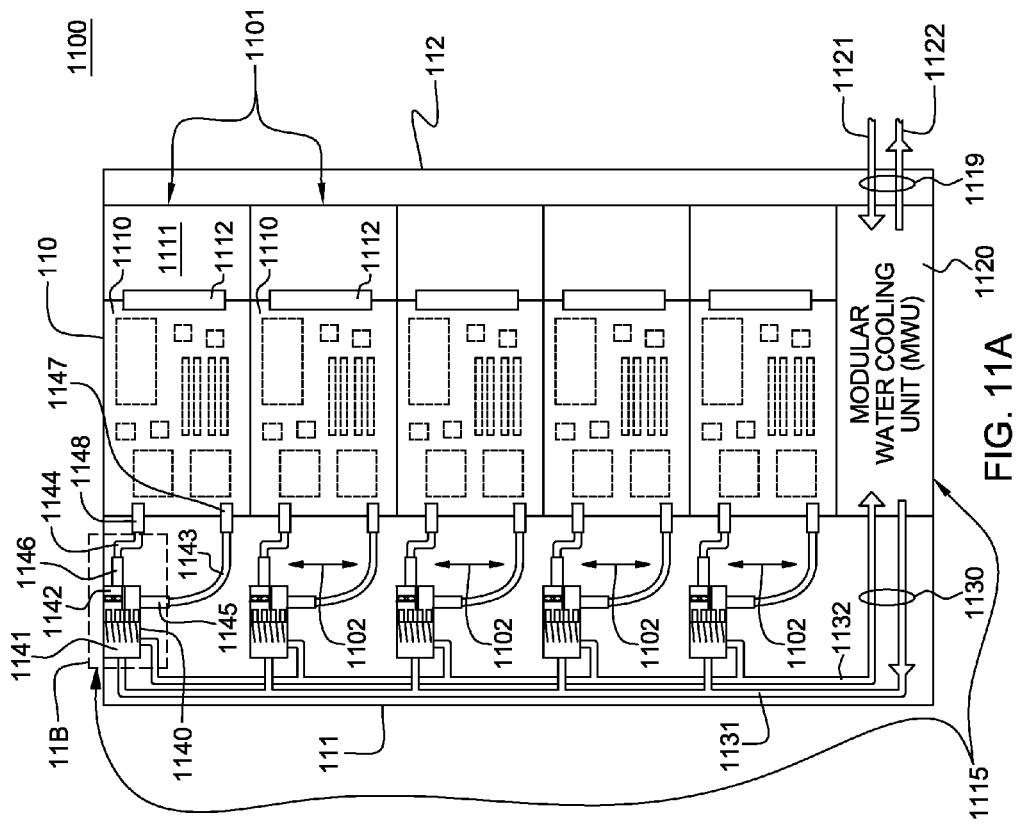

APPARATUS AND METHOD WITH FORCED COOLANT VAPOR MOVEMENT FOR FACILITATING TWO-PHASE COOLING OF AN ELECTRONIC DEVICE

BACKGROUND

The present invention relates in general to heat transfer mechanisms, and more particularly, to cooling apparatuses and methods of fabrication thereof for facilitating removal of heat generated by one or more electronic devices.

As is known, operating electronic devices produce heat. This heat needs to be removed from the devices in order to maintain device junction temperatures within desirable limits, with failure to remove heat effectively resulting in increased device temperatures, potentially leading to thermal runaway conditions. Several trends in the electronics industry have combined to increase the importance of thermal management for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

The need to cool current and future high heat load, high heat flux electronic devices therefore mandates the development of aggressive thermal management techniques, using liquid cooling. Various types of liquid coolants provide different cooling capabilities. For example, fluids such as refrigerants or other dielectric liquids (e.g., fluorocarbon liquid) exhibit lower thermal conductivity and specific heat properties compared to liquids such as water or other aqueous fluids. Dielectric liquids have an advantage, however, in that they may be placed in direct physical contact with electronic devices and their interconnects without adverse affects, such as corrosion or electrical short circuits. Other cooling liquids, such as water or other aqueous fluids, exhibit superior thermal conductivity and specific heat compared with dielectric fluids. Water-based coolants, however, must be kept from physical contact with electronic devices and interconnects, since corrosion and electrical short circuit problems are otherwise likely to result.

BRIEF SUMMARY

In one aspect, the shortcomings of the prior art are overcome and additional advantages are provided through the provision of an apparatus for facilitating cooling of one or more electronic devices. The apparatus includes a coolant flow path, a vapor condenser and at least one vapor fan. The coolant flow path is in fluid communication with the one or more electronic devices, and upon contacting the one or more electronic devices, liquid dielectric coolant in the coolant flow path vaporizes to form dielectric coolant vapor, thereby facilitating cooling of the one or more electronic devices. The vapor condenser is in fluid communication with the coolant flow path for facilitating condensate formation from the dielectric coolant vapor, and the at least one vapor fan is disposed to facilitate movement of dielectric coolant vapor into contact with the vapor condenser, and thereby facilitate cooling of the one or more electronic devices through enhanced coolant condensate formation and thus enhanced recirculation of the coolant condensate as the liquid dielectric coolant.

In another aspect, a cooled electronic device is provided comprising a substrate, at least one electronic device coupled to the substrate, and a cooling apparatus for cooling the at least one electronic device. The cooling apparatus includes a coolant flow path, a vapor condenser, and at least one vapor fan. The coolant flow path is in fluid communication with the at least one electronic device, wherein upon contacting a surface to be cooled associated with the at least one electronic device, liquid dielectric coolant in the coolant flow path vaporizes to form dielectric coolant vapor, thereby facilitating cooling of the surface to be cooled. The vapor condenser is in fluid communication with the coolant flow path for facilitating liquid coolant condensate formation from the dielectric coolant vapor, and the at least one vapor fan is disposed to facilitate movement of dielectric coolant vapor into contact with the vapor condenser, and thereby facilitate cooling of the surface to be cooled associated with the at least one electronic device through enhanced coolant condensate formation and thus enhanced recirculation of the coolant condensate as the liquid dielectric coolant.

In another aspect, a method of facilitating cooling of an electronic device is provided. The method includes: providing a liquid dielectric coolant in contact with the electronic device during operation thereof, wherein the liquid dielectric coolant vaporizes to form dielectric coolant vapor, thereby facilitating cooling of the electronic device; providing a vapor condenser in fluid communication with a coolant flow path for facilitating coolant condensate formation from the dielectric coolant vapor; and utilizing at least one vapor fan disposed within the coolant flow path to actively move the dielectric coolant vapor into contact with vapor condenser, and thereby facilitate cooling of the electronic device by facilitating coolant condensate formation, and thus recirculation of liquid dielectric coolant through the coolant flow path.

Further, additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 11A is a cross-sectional elevational view of one embodiment of an electronics rack and cooling apparatus utilizing two-phase dielectric coolant cooling of one or more electronic subsystems within the electronics rack, in accordance with an aspect of the present invention;

FIG. 11B is a partial enlargement of the cooling apparatus of FIG. 11A, illustrating one embodiment of the chassis-level manifold structure of the cooling apparatus of FIG. 11A, in accordance with an aspect of the present invention;

DETAILED DESCRIPTION

Figure 1:
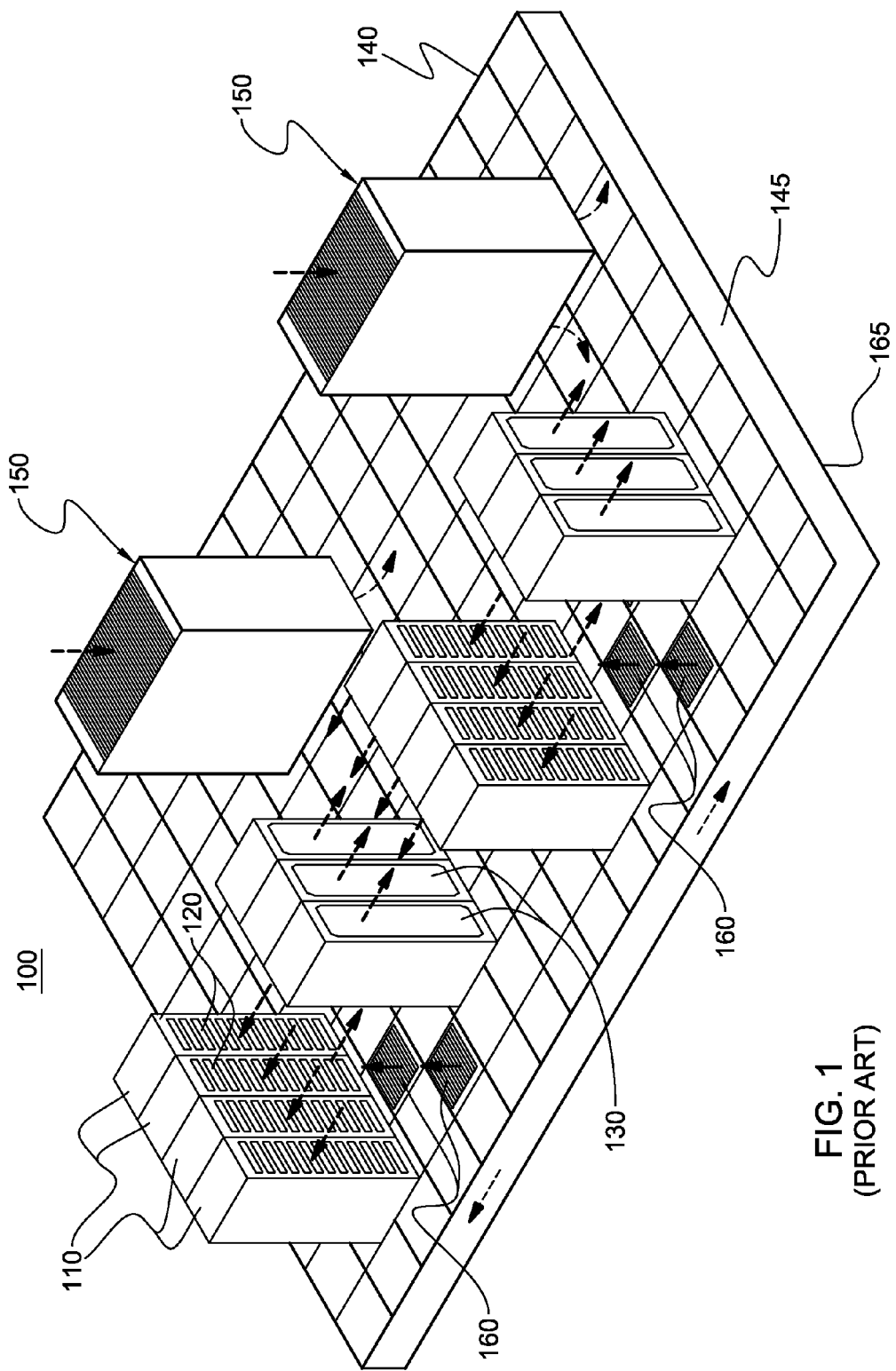
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system or electronic system, and may be, for example, a stand alone computer processor having high, mid or low end processing capability. In one embodiment, an electronics rack may comprise multiple electronic subsystems or drawers, each having one or more heat-generating components disposed therein requiring cooling. "Electronic subsystem" refers to any sub-housing, blade, book, drawer, node, compartment, etc., having one or more heat-generating electronic devices disposed therein. Each electronic subsystem of an electronics rack may be movable or fixed relative to the electronics rack, with the rack-mounted electronics drawers and blades of a blade center system being two examples of subsystems of an electronics rack to be cooled.

"Electronic device" refers to any heat-generating electronic device of, for example, a computer system or other electronics unit requiring cooling. By way of example, an electronic device may comprise one or more integrated circuit dies (or chips) and/or other electronic devices to be cooled, including one or more processor chips, memory chips and memory support chips. As a further example, the electronic device may comprise one or more bare dies or one or more packaged dies disposed on a common carrier. As used herein, "primary heat-generating component" refers to a primary heat-generating electronic device within an electronic subsystem, while "secondary heat-generating component" refers to an electronic device of the electronic subsystem generating less heat than the primary heat-generating component to be cooled. "Primary heat-generating die" refers, for example, to a primary heat-generating die or chip within a heat-generating electronic device comprising primary and secondary heat-generating dies (with a processor die being one example). "Secondary heat-generating die" refers to a die of a multi-die electronic device generating less heat than the primary heat-generating die thereof (with memory dies and memory support dies being examples of secondary dies to be cooled). As one example, a heat-generating electronic device could comprise multiple primary heat-generating bare dies and multiple secondary heat-generating dies on a common carrier. Further, the term "cold plate" refers to any thermally conductive structure having one or more channels or passageways formed therein for flowing of coolant therethrough. In addition, "metallurgically bonded" refers generally herein to two components being welded, brazed or soldered together by any means.

As used herein, a "liquid-to-liquid heat exchanger" may comprise, for example, two or more coolant flow paths, formed of thermally conductive tubings (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

An example of facility coolant is water, while one example of system coolant is a dielectric coolant. However, the cooling concepts disclosed herein are readily adapted to use with other types of coolant on the facility side and/or on the system side. For example, one or more of the coolants may comprise a brine, a fluorocarbon liquid, a hydrofluoroether liquid, a liquid metal, or other similar coolant, or refrigerant, while still maintaining the advantages and unique features of the present invention.

Reference is made below to the drawings, which are not drawn to scale to facilitate an understanding thereof, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room.

Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of the electronics racks 110.

Figure 2:
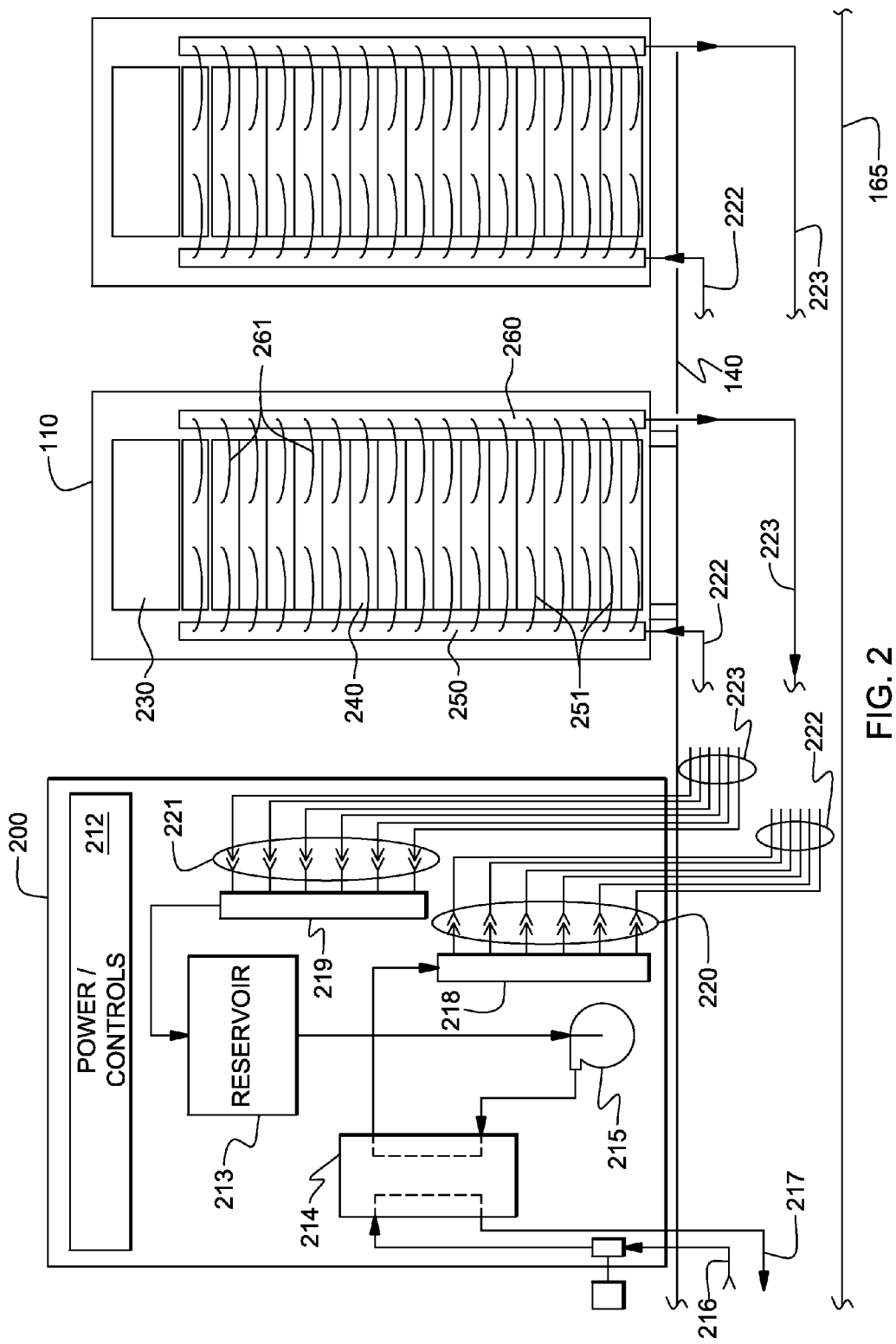
FIG. 2 depicts one embodiment of a coolant distribution unit for liquid-cooling of one or more electronics racks of a data center, in accordance with an aspect of the present invention.
Figure 3:
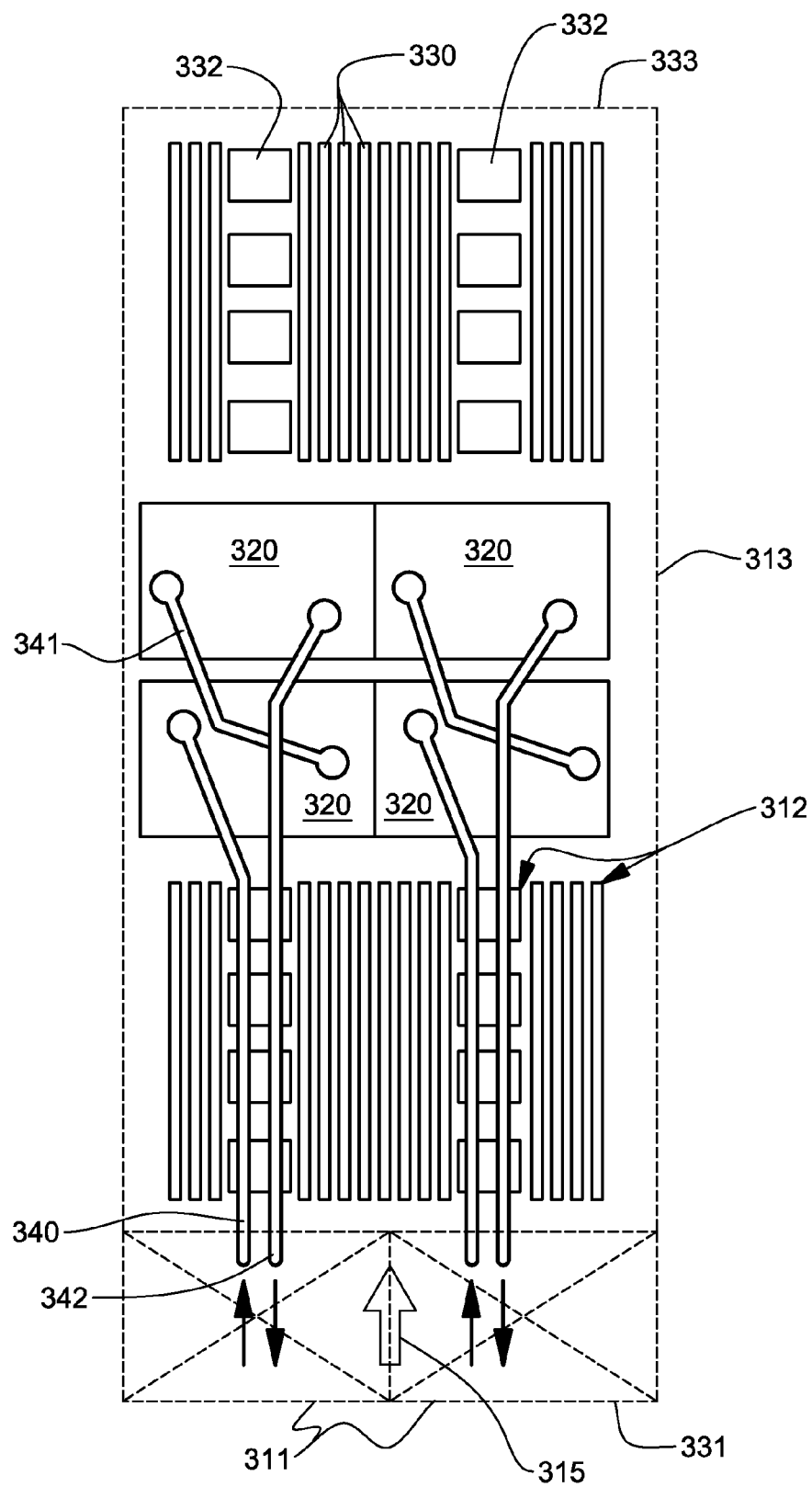
FIG. 3 is a plan view of one embodiment of an electronic subsystem layout illustrating an air and liquid cooling system for cooling components of the electronic subsystem, in accordance with an aspect of the present invention.
Figure 4:
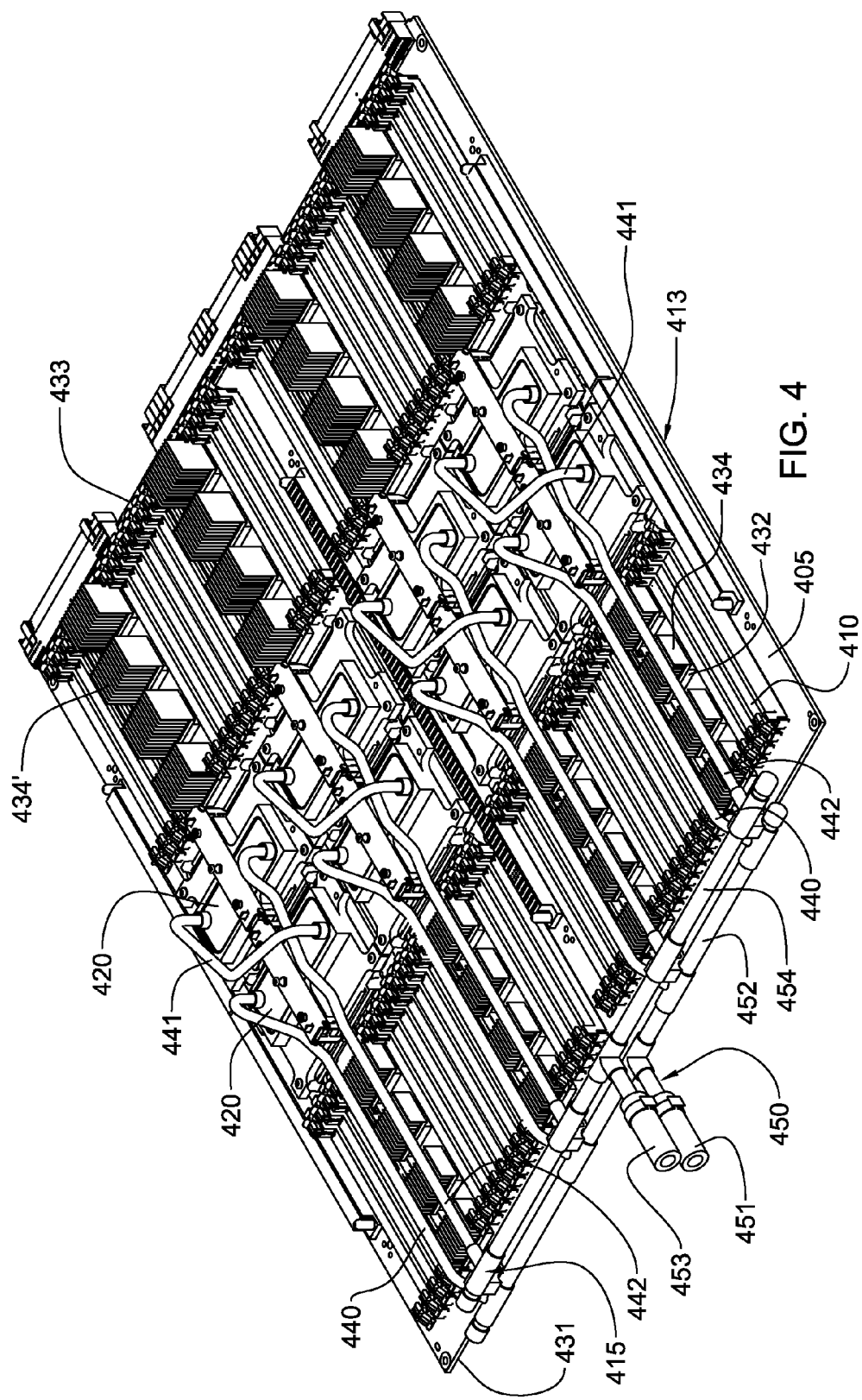
FIG. 4 depicts one detailed embodiment of a partially assembled electronic subsystem layout, wherein the electronic subsystem includes eight heat-generating electronic devices to be cooled, each having a respective cooling apparatus associated therewith, in accordance with an aspect of the present invention.

Due to the ever-increasing airflow requirements through electronics racks, and the limits of air distribution within the typical data center installation, liquid-based cooling is being combined with the conventional air-cooling. FIGS. 2-4 illustrate one embodiment of a data center implementation employing a liquid-based cooling system with one or more cold plates coupled to high heat-generating electronic devices disposed within the electronics racks.

FIG. 2 depicts one embodiment of a coolant distribution unit 200 for a data center. The coolant distribution unit is conventionally a large unit which occupies what would be considered a full electronics frame. Within coolant distribution unit 200 is a power/control element 212, a reservoir/expansion tank 213, a heat exchanger 214, a pump 215 (often accompanied by a redundant second pump), facility water inlet 216 and outlet 217 supply pipes, a supply manifold 218 supplying water or system coolant to the electronics racks 110 via couplings 220 and lines 222, and a return manifold 219 receiving water from the electronics racks 110, via lines 223 and couplings 221. Each electronics rack includes (in one example) a power/control unit 230 for the electronics rack, multiple electronic subsystems 240, a system coolant supply manifold 250, and a system coolant return manifold 260. As shown, each electronics rack 110 is disposed on raised floor 140 of the data center with lines 222 providing system coolant to system coolant supply manifolds 250 and lines 223 facilitating return of system coolant from system coolant return manifolds 260 being disposed in the supply air plenum beneath the raised floor.

In the embodiment illustrated, the system coolant supply manifold 250 provides system coolant to the cooling systems of the electronic subsystems (more particularly, to liquid-cooled cold plates thereof) via flexible hose connections 251, which are disposed between the supply manifold and the respective electronic subsystems within the rack. Similarly, system coolant return manifold 260 is coupled to the electronic subsystems via flexible hose connections 261. Quick connect couplings may be employed at the interface between flexible hoses 251, 261 and the individual electronic subsystems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger disposed at an air outlet side thereof, which also receives system coolant from the system coolant supply manifold 250 and returns system coolant to the system coolant return manifold 260.

FIG. 3 depicts one embodiment of an electronic subsystem 313 component layout wherein one or more air moving devices 311 provide forced air flow 315 to cool multiple components 312 within electronic subsystem 313. Cool air is taken in through a front 331 and exhausted out a back 333 of the subsystem. The multiple components to be cooled include multiple processor modules to which liquid-cooled cold plates 320 (of a liquid-based cooling system) are coupled, as well as multiple arrays of memory modules 330 (e.g., Dual In-line Memory Modules (DIMMs)) and multiple rows of memory support modules 332 (e.g., DIMM control modules) to which air-cooled heat sinks are coupled. In the embodiment illustrated, memory modules 330 and the memory support modules 332 are partially arrayed near front 331 of electronic subsystem 313, and partially arrayed near back 333 of electronic subsystem 313. Also, in the embodiment of FIG. 3, memory modules 330 and the memory support modules 332 are cooled by air flow 315 across the electronic subsystem.

The illustrated liquid-based cooling system further includes multiple coolant-carrying tubes connected to and in fluid communication with liquid-cooled cold plates 320. The coolant-carrying tubes comprise sets of coolant-carrying tubes, with each set including (for example) a coolant supply tube 340, a bridge tube 341 and a coolant return tube 342. In this example, each set of tubes provides liquid coolant to a series-connected pair of cold plates 320 (coupled to a pair of processor modules). Coolant flows into a first cold plate of each pair via the coolant supply tube 340 and from the first cold plate to a second cold plate of the pair via bridge tube or line 341, which may or may not be thermally conductive. From the second cold plate of the pair, coolant is returned through the respective coolant return tube 342.

FIG. 4 depicts in greater detail an alternate electronic subsystem layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem illustrated is cooled and conditioned water.

FIG. 4 is an isometric view of one embodiment of an electronic subsystem or drawer, and monolithic cooling system. The depicted planar server assembly includes a multi-layer printed circuit board to which memory DIMM sockets and various electronic devices to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to facilitate cooling one or more electronic devices to which the cold plates are mechanically and thermally coupled. The number of parallel paths and the number of series-connected liquid-cooled cold plates depends, for example, on the desired device temperature, available coolant temperature and coolant flow rate, and the total heat load being dissipated from each electronic device.

More particularly, FIG. 4 depicts a partially assembled electronic subsystem 413 and an assembled liquid-based cooling system 415 coupled to primary heat-generating components (e.g., including processor dies) to be cooled. In this embodiment, the electronics system is configured for (or as) an electronics drawer of an electronics rack, and includes, by way of example, a support substrate or planar board 405, a plurality of memory module sockets 410 (with the memory modules (e.g., dual in-line memory modules) not shown), multiple rows of memory support modules 432 (each having coupled thereto an air-cooled heat sink 434), and multiple processor modules (not shown) disposed below the liquid-cooled cold plates 420 of the liquid-based cooling system 415.

In addition to liquid-cooled cold plates 420, liquid-based cooling system 415 includes multiple coolant-carrying tubes, including coolant supply tubes 440 and coolant return tubes 442 in fluid communication with respective liquid-cooled cold plates 420. The coolant-carrying tubes 440, 442 are also connected to a header (or manifold) subassembly 450 which facilitates distribution of liquid coolant to the coolant supply tubes and return of liquid coolant from the coolant return tubes 442. In this embodiment, the air-cooled heat sinks 434 coupled to memory support modules 432 closer to front 431 of electronic subsystem 413 are shorter in height than the air-cooled heat sinks 434' coupled to memory support modules 432 near back 433 of electronic subsystem 413. This size difference is to accommodate the coolant-carrying tubes 440, 442 since, in this embodiment, the header subassembly 450 is at the front 431 of the electronics drawer and the multiple liquid-cooled cold plates 420 are in the middle of the drawer.

Liquid-based cooling system 415 comprises a pre-configured monolithic structure which includes multiple (pre-assembled) liquid-cooled cold plates 420 configured and disposed in spaced relation to engage respective heat-generating electronic devices. Each liquid-cooled cold plate 420 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 420 to the associated electronic device to form the cold plate and electronic device assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 4, header subassembly 450 includes two liquid manifolds, i.e., a coolant supply header 452 and a coolant return header 454, which in one embodiment, are coupled together via supporting brackets. In the monolithic cooling structure of FIG. 4, the coolant supply header 452 is metallurgically bonded in fluid communication to each coolant supply tube 440, while the coolant return header 454 is metallurgically bonded in fluid communication to each coolant return tube 452. A single coolant inlet 451 and a single coolant outlet 453 extend from the header subassembly for coupling to the electronics rack's coolant supply and return manifolds (not shown).

FIG. 4 also depicts one embodiment of the pre-configured, coolant-carrying tubes. In addition to coolant supply tubes 440 and coolant return tubes 442, bridge tubes or lines 441 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 440, bridge tubes 441 and coolant return tubes 442 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

Based on current research and development trends and activities, it is anticipated that three-dimensional chip packages may be employed in future electronics subsystems, such as servers. Because of the three-dimensional physical profile, as well as projected heat dissipation requirements, significant cooling challenges are presented for thermal designers. Immersion cooling or direct impingement cooling are considered herein to be viable thermal management techniques for such three-dimensional chip packages, because the third dimension of the chip package can be utilized for heat transfer as well as the interstitial gaps to which a more conventional cold plate-based approach might not have access.

In an immersion-cooled or direct impingement-cooled device, there are two transfer mechanisms, namely, boiling and condensation. Considerable literature exists in the art on the enhancement of boiling techniques, which focus on extracting heat from a heated surface (such as a chip surface). However, the vapor condensation structure's ability to condense the requisite amount of vapor commensurate with the required heat transfer rate (from the chip package, e.g., single-chip module or multi-chip module) can be a limiting factor because of the limited volume available for condensation. Presented hereinbelow therefore are device-level and system-level approaches that utilize one or more vapor-immersed fans to enhance the condensation heat transfer rates on the cooling fin structures which are used to transfer heat from the boiled coolant vapor to a secondary loop of coolant, such as facility-chilled water or air.

Figure 5:
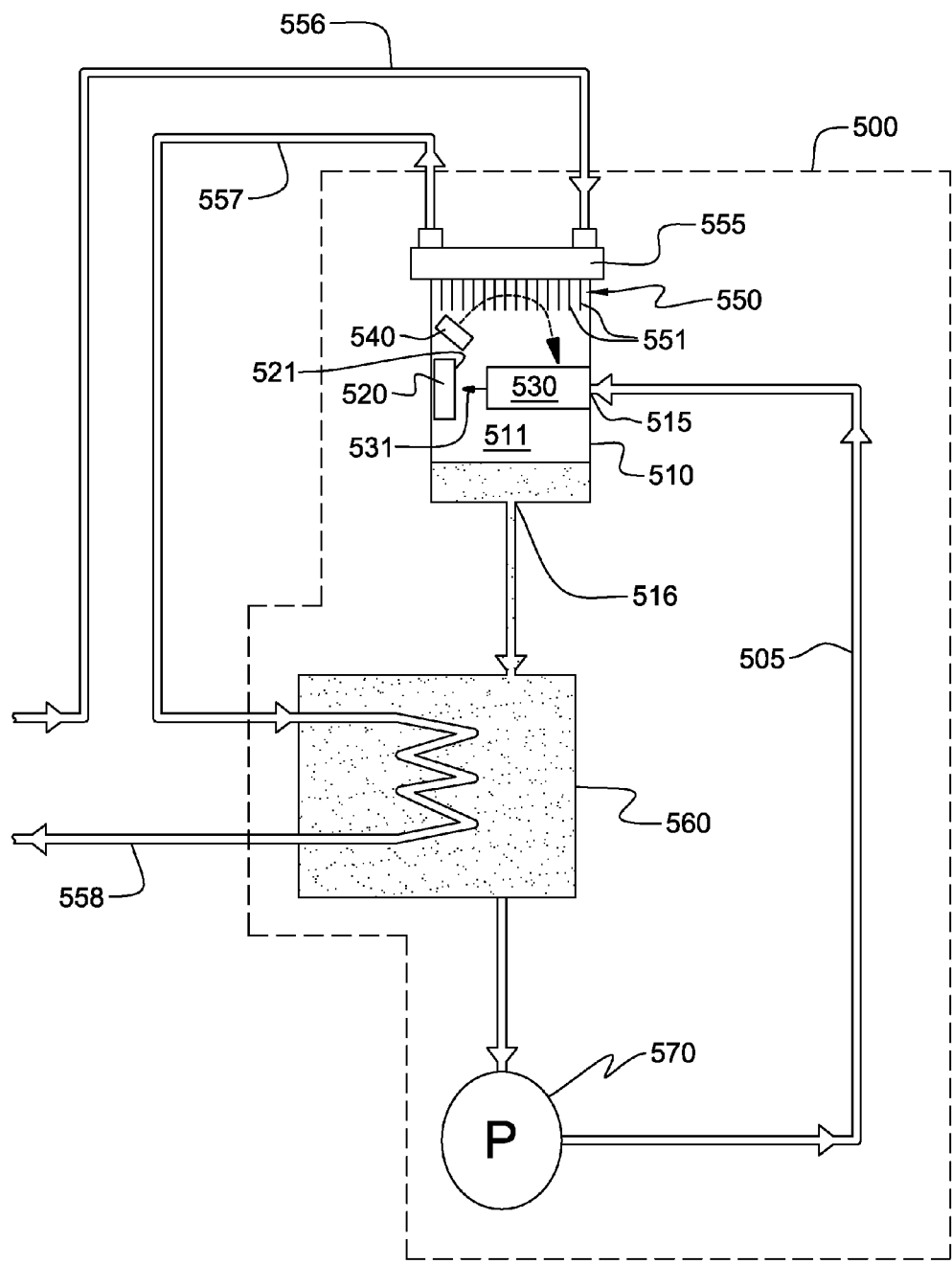
FIG. 5 is a schematic one embodiment of a cooling apparatus utilizing, in part, a two-phase dielectric coolant for facilitating cooling of one or more electronic devices, in accordance with an aspect of the present invention.

FIG. 5 illustrates an electronic device(s) 520 disposed within an electronics system 500 utilizing one embodiment of a cooling apparatus such as disclosed herein for cooling the electronic device. As illustrated, the cooling apparatus includes a coolant flow path 505 in fluid communication with electronic device(s) 520. In one embodiment, liquid dielectric coolant is delivered via coolant inlet 515 to a spray nozzle 530, which directs a spray cone 531 of liquid dielectric coolant towards a surface 521 to be cooled associated with electronic device(s) 520. The surface 521 to be cooled may comprise a main surface of electronic device(s) 520, such as a back side of the electronic device, or alternatively, may comprise a thermally conductive surface, such as a thermal spreader, coupled to electronic device(s) 520. A housing 510 at least partially surrounds and forms a compartment 511 about electronic device(s) 520. Housing 510 includes a vapor condenser 550 having a thermally conductive base plate and a plurality of thermally conductive condenser fins 551 extending from the thermally conductive base plate into compartment 511 in an upper portion of the compartment. A liquid-cooled cold plate 555 is in thermal contact with vapor condenser 550 to facilitate cooling of the thermally conductive condenser fins 551, and thus, facilitate coolant condensate formation on the thermally conductive condenser fins.

In operation, liquid dielectric coolant contacting the surface 521 to be cooled associated with electronic device 520 vaporizes to form dielectric coolant vapor, which facilitates cooling of the electronic device via latent heat transfer. The dielectric coolant vapor rises in a direction of vapor condenser 550 and is facilitated in its movement towards the vapor condenser via one or more vapor fans 540 positioned within the coolant flow path within housing 510. As used herein "vapor fan" refers to any air-moving device sized and configured to function within the compartments illustrated and described herein.

Advantageously, the one or more vapor fans 540 actively move or force coolant vapor rising within the compartment towards the vapor condenser 550, and in particular, towards the plurality of thermally conductive condenser fins 551, to enhance coolant condensate formation. One embodiment of a fan which could be employed as a vapor fan in accordance with the present invention, is described further in "Small Fans for Cooling Small Electronic Devices", by Masahura Miyahara, Sunonwealth Electronic Machine Industry Company, Ltd., Electronics Cooling Magazine, May 2009.

Liquid coolant condensate from thermally conductive condenser fins 551 drops to a lower portion of compartment 511, from which it is drawn through a coolant outlet 516 to pass through a sub-cooling heat exchanger 560 and be pumped via a coolant pump 570 for return through coolant flow path 505 to compartment 511 via spray nozzle 530. In the embodiment illustrated, a facility coolant, such as conditioned and cooled water, is fed via a supply line 556 to liquid-cooled cold plate 555 for cooling vapor condenser 550, and thereafter, via connecting line 557 to sub-cooling heat exchanger 560 (where the recirculating coolant condensate is sub-cooled), before being exhausted via a return line 558 to the facility coolant source (not shown).

In one embodiment, electronics system 500 may comprise an electronics node of a multi-node electronics rack, with the cooled and conditioned water being provided through supply lines and return lines in a manner such as described above in connection with FIGS. 2-4. Also, note that use of a dielectric coolant advantageously allows the coolant to physically contact the electronic device, as well as the interconnects of the electronic device to the underlying substrate, without creating corrosion or electrical short circuit issues.

The dielectric coolant employed in the cooling apparatus disclosed herein can be any of several commonly available dielectric fluids. Examples include the Novec™ Fluids, manufactured by 3M Corporation of St. Paul, Minn., U.S.A. (e.g., FC-72, FC-86, HFE-7000 and HFE-7200). Alternatively, the coolant could be a refrigerant.

As one detailed example, the one or more electronic devices 520 illustrated in FIG. 5 might comprise a three-dimensional chip package, with the housing 510 defining a cooled server module for next generation server nodes. The dielectric coolant spray directly impinges cooled liquid dielectric coolant on the back side of the silicon dies, and the liquid coolant boils (or evaporates) upon contact and is transformed into dielectric coolant vapor, which travels upwards under the influence of its own buoyancy, as well as from the forced vapor flow effected by the one or more vapor fans. The dielectric coolant vapor is forced through and over the thermally conductive condenser fins, leading to its condensation into liquid condensate, which then drops to the bottom portion of the compartment via gravity. Thus, there is a collection of liquid condensate in the lower portion of the compartment, as illustrated. This liquid condensate is then evacuated from the module (through a sub-cooling heat exchanger) via pumping from the coolant pump. After leaving the sub-cooling heat exchanger and passing through the pump, the liquid is forced back into the module under pressure through a spray or a jet nozzle. As noted, condensation of the vapor within the compartment is effected, in part, through the use of liquid-cooled cold plate 555, which receives chilled water from, for example, a coolant distribution unit (not shown) or a building chilled water loop. After effecting condensation of vapor within the compartment, the same water is passed (in one embodiment) through the heat rejection side of the sub-cooling heat exchanger. Sub-cooling of the liquid dielectric coolant prior to impingement on the surface to be cooled (via two-phase heat transfer) increases the critical heat flux (CHF), thus yielding higher heat transfer rates than would otherwise be achieved.

Figure 6:
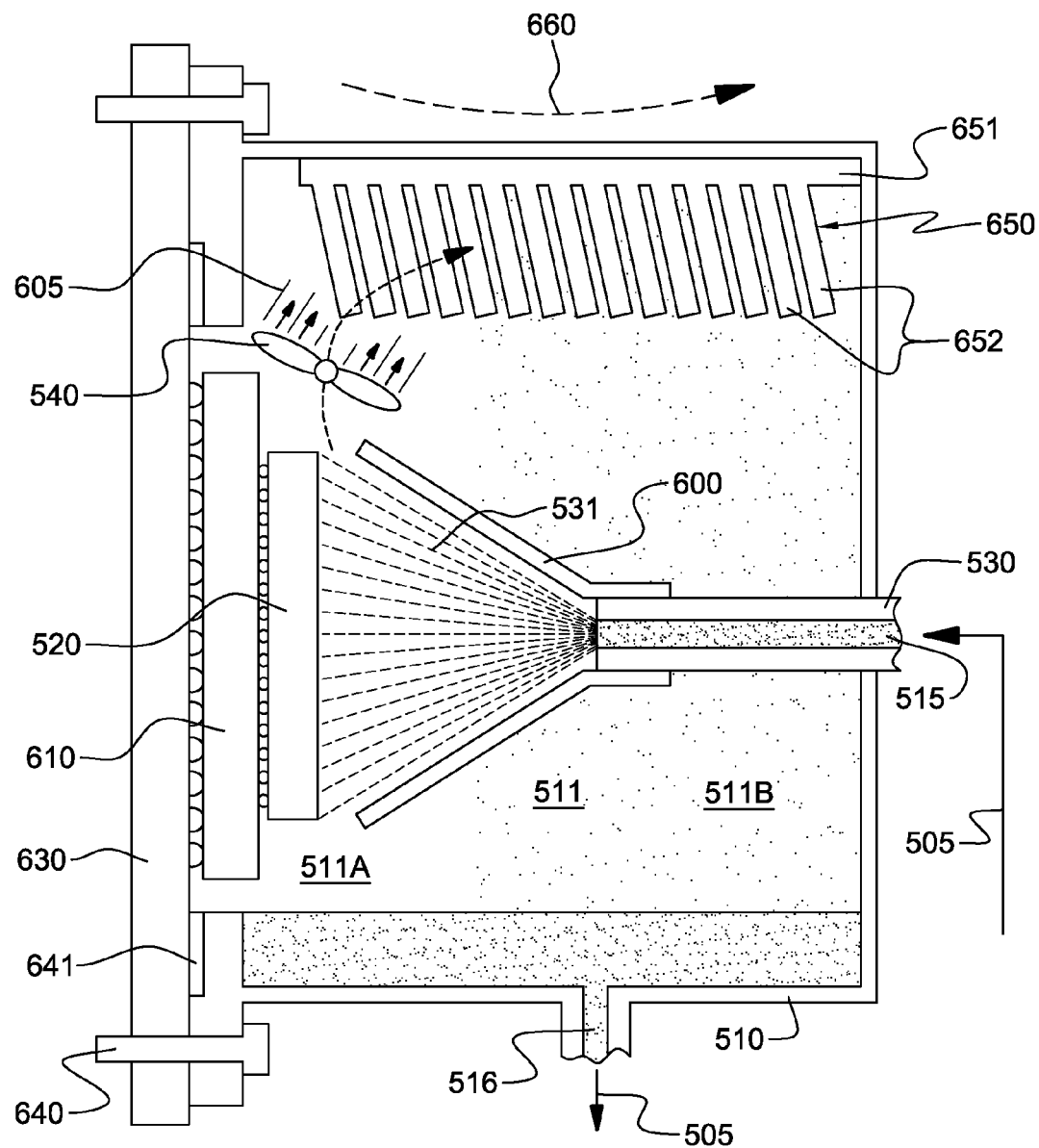
FIG. 6 is an enlarged, partial alternate embodiment of a cooling apparatus utilizing two-phase dielectric coolant cooling of one or more electronic devices, in accordance with an aspect of the present invention.

FIG. 6 depicts an enlarged, alternate embodiment of a cooling apparatus utilizing two-phase dielectric coolant cooling of one or more electronic devices. As illustrated, this cooling apparatus includes a coolant flow path 505 which passes dielectric coolant through housing 510 defining compartment 511 within which one or more electronic devices 520 to be cooled are disposed. A surface of electronic device(s) 520 is cooled via a spray cone 531 of liquid dielectric coolant produced by a spray nozzle 530 in fluid communication with coolant inlet 515. Liquid condensate accumulates in a lower portion of compartment 511 and is re-circulated through coolant flow path 505 via a coolant outlet 516. The electronic device(s) 520 may comprise any heat-generating electronic device, such as a processor or other integrated circuit die, or a three-dimensional stack of such processors or integrated circuit die.

Housing 510 is sized to at least partially surround and form compartment 511 about electronic device(s) 520 to be cooled. The housing is a shell-like component that is attached to, for example, a printed circuit board 630 using bolts or screws 640 and a sealing gasket (or O-ring) 641, which is compressed between a lower surface of the housing and an upper surface of the board, or alternatively, between a lower surface of the housing and an upper surface of a substrate 610 to which the one or more electronic devices 520 directly couple. As shown, multiple electrical connections, such as C4 connections, electrically couple the electronic device(s) to substrate 610, which in this embodiment is itself electrically coupled via another set of electrical connections to printed circuit board 630.

As used herein, the word "substrate" refers to any underlying supporting structure, such as substrate 610 or printed circuit board 630 to which the electronic device(s) is coupled, and to which the housing may be sealed in order to form compartment 511 about the electronic device(s). Sealing gasket 641 seals off the inner compartment of the housing and assists in retaining the dielectric coolant within the compartment.

When in operation, as liquid dielectric coolant contacts the one or more electronic devices 520 to be cooled, it undergoes phase change from liquid phase to vapor phase, and thus utilizes its latent heat of vaporization for cooling purposes. The resultant dielectric coolant vapor rises to the upper portion of the compartment, forming a dielectric coolant vapor layer at the upper portion of the compartment. Movement of the dielectric coolant vapor upwards is assisted (in this embodiment) via a vapor fan 540 disposed in the dielectric coolant flow path. Vapor fan 540 actively moves dielectric coolant vapor upwards towards the vapor condenser 650 to facilitate condensation of the coolant vapor on the vapor condenser. A plurality of vapor vanes (or baffles) 605 are also used to direct the dielectric coolant vapor upwards towards the vapor condenser. Vapor condenser 650 includes a thermally conductive base 651 from which a plurality of thermally conductive condenser fins 652 extend. These condenser fins comprise (in this example) angled condenser fins which facilitate movement of the condensate liquid away from the spray cone 531 when dropping within compartment 511 in condensate-rich region 511B. Thus, vapor-rich region 511A has substantially less liquid condensate dropping therethrough due to the angling of the thermally conductive condenser fins. Note that vapor-rich region 511A is closer to the electronic device(s), while the region on the other side of the compartment away from the electronic device(s) is the condensate-rich region 511B.

Additionally, a shield, such as a spray cone shroud 600, is disposed within compartment 511 about at least a portion of spray cone 531 to prevent liquid condensate dropping within the compartment from the plurality of thermally conductive condenser fins 652 from interfering with spray cone 531. The vapor condenser 650 is cooled via liquid or air movement 660 through a corresponding liquid-cooled cold plate or air-cooled heat sink (not shown).

Figure 7:
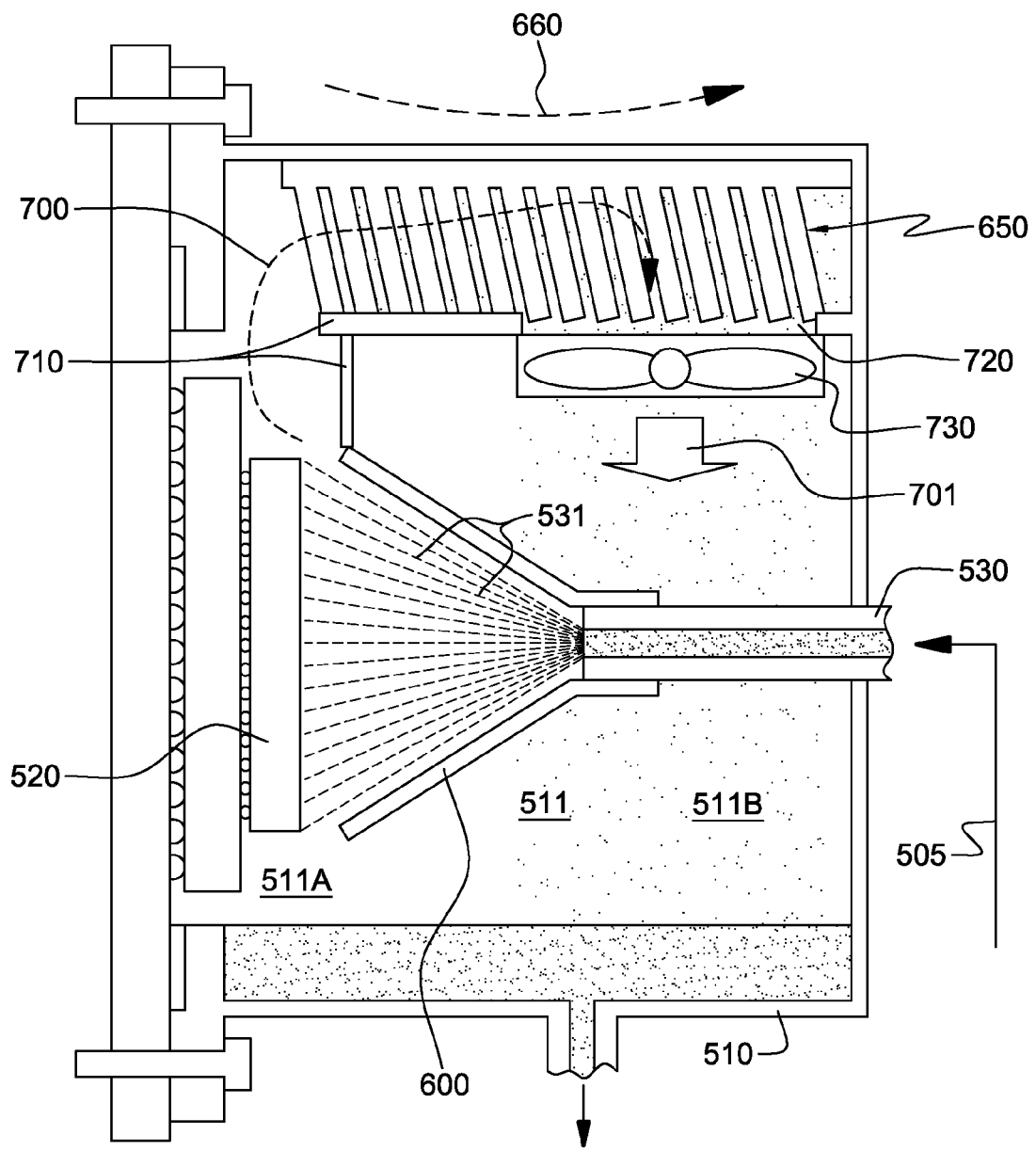
FIG. 7 is an enlarged, partial embodiment of another cooling apparatus utilizing two-phase dielectric coolant cooling of one or more electronic devices, in accordance with an aspect of the present invention.

FIG. 7 illustrates another embodiment of a cooling apparatus utilizing two-phase dielectric coolant cooling of one or more electronic devices. Sub-cooled liquid dielectric coolant is received via coolant flow path 505 into housing 510 via spray nozzle 530, which directs liquid dielectric coolant as a spray cone 531 towards one or more electronic devices 520 to be cooled to produce dielectric coolant vapor. The resultant dielectric coolant vapor rises within compartment 511 in a direction 700 to contact vapor condenser 650. Vapor baffles 710 are provided within compartment 511 to facilitate movement of the dielectric coolant vapor into contact with vapor condenser 650. Additionally, one or more vapor fans 730 are positioned within an opening 720 in vapor baffles 710 below a portion of the thermally conductive condenser fins of vapor condenser 650 to facilitate drawing the dielectric coolant vapor into contact with the vapor condenser and drawing downwards 701 liquid condensate from the plurality of thermally conductive condenser fins, thereby defining condensate-rich region 511B of compartment 511, with the remaining portion closer to the one or more electronic devices being the vapor-rich region 511A. Liquid or air-cooling via path 660 could be employed to cool vapor condenser 650 and thereby further facilitate liquid condensate formation from the dielectric coolant vapor. Note that, in this embodiment, the location of the vapor fan is different than in the embodiments of FIGS. 5 & 6, and thus, instead of pushing the dielectric coolant vapor towards the vapor condenser, the vapor fan in the embodiment of FIG. 7 draws the dielectric coolant vapor into contact with the vapor condenser. Further, the vapor fan in this embodiment is drawing the condensate-rich mixture away from the vapor condenser and pushing it towards the lower portion of the compartment. Note that this configuration advantageously allows for use of a larger vapor fan than may be possible with the configurations of FIGS. 5 & 6.

Figure 8:
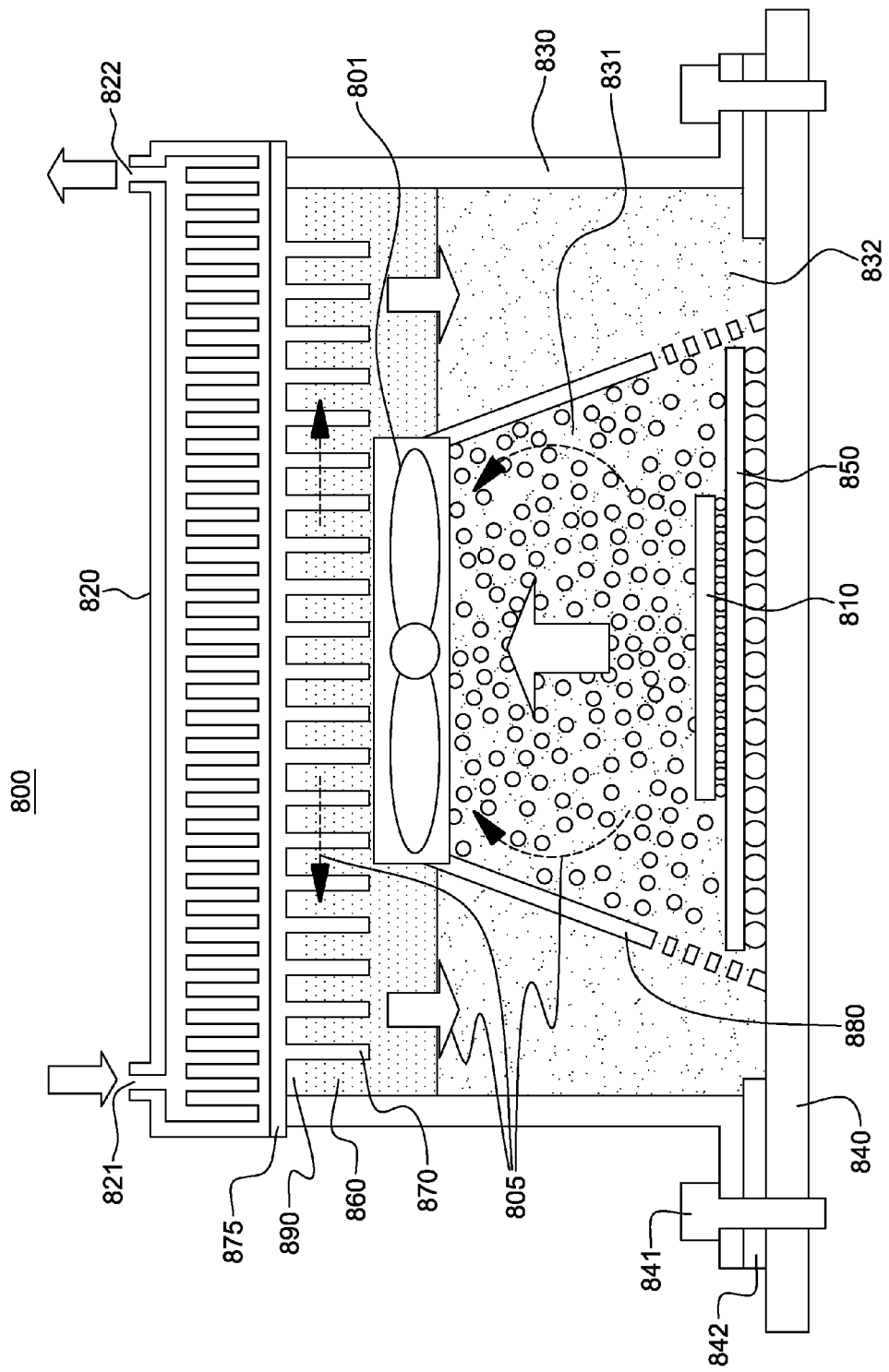
FIG. 8 is a cross-sectional elevational view of a further embodiment of a cooling apparatus utilizing two-phase dielectric coolant cooling of one or more electronic devices, in accordance with an aspect of the present invention.

FIG. 8 depicts one embodiment of a vapor fan-enhanced, immersion-cooled electronic device 800, which includes a structural and thermal interface between a heat-generating electronic device 810, such as a processor or other integrated circuit die(s), and a liquid-cooled cold plate 820, such as the above-described liquid-cooled cold plate 420 of the electronics subsystem of FIG. 4. Cooled electronic device 800 includes a module casing 830 which forms a part of a housing, configured to at least partially surround and form a sealed, fluid-tight compartment 831 about electronic device 810 to be cooled. As shown, dielectric coolant 832 is disposed within sealed compartment 831, as is a vapor fan 801, which is positioned in an upper portion of compartment 831 to direct dielectric coolant vapor upwards via a coolant flow path 805 within the sealed compartment, towards the vapor condenser (described below) in the upper portion of the compartment.

The housing is a shell-like component that is attached to, for example, a printed circuit board 840 using bolts or screws 841 and a sealing gasket (or O-ring) 842, which is compressed between a lower surface of the housing and a upper surface of the board, or alternatively, between a lower surface of the housing and an upper surface of a substrate 850, to which the one or more electronic devices 810 directly couple. As shown, multiple electrical connections, such as C4 connections, electrically couple the one or more electronic devices 810 to substrate 850, which in this embodiment, is itself electrically coupled via another set of electrical connections to printed circuit board 840.

As noted above, the word "substrate" refers to any underlying supporting structure, such as substrate 850 or printed circuit board 840, to which the one or more electronic devices are coupled, and to which the housing may be sealed in order to form sealed compartment 831 about the one or more electronic devices. Sealing gasket 842 seals off the inner compartment of the housing and assists in retaining dielectric fluid within the sealed compartment.

Vapor fan 801 is positioned, sized and configured to force dielectric coolant vapor rising within the compartment towards the vapor condenser in the upper portion of the compartment. As illustrated, when in operation, as liquid dielectric coolant absorbs heat, it undergoes phase change from liquid phase to vapor phase, and thus utilizes its latent heat of vaporization for cooling purposes. The resultant dielectric coolant vapor rises to the upper portion of the sealed compartment, in part, via the movement of vapor fan 801 and forms a dielectric vapor layer 860 in the upper portion of the sealed compartment. Vapor rises since it is significantly lower density compared with the surrounding dielectric liquid, and since the vapor fan is moving the vapor upwards. A submerged baffle (or vapor barrier) 880 facilitates directing dielectric coolant vapor upwards to the upper portion of the sealed compartment via vapor fan 801. At the upper-most portion of the sealed compartment, there is illustrated a thin, non-condensable gas layer 890 comprising gases, such as air, which have also left the liquid and traveled upwards. These gases can reside in solution within the dielectric fluid, but once out-gassed through the boiling process, cannot be returned to solution via a cooling condensation process.

As depicted, cooled electronic device 800 further comprises a plurality of thermally conductive condenser fins 870 extending into the sealed compartment from a top wall (e.g., a thermally conductive base structure 875) of the housing. In one embodiment, these condenser fins are appropriately sized for the anticipated dielectric coolant vapor layer 860 to form in the upper portion of the sealed compartment with operation of the heat-generating electronic device(s). Upon reaching the upper portion of the sealed compartment, the dielectric fluid vapor contacts the cool surfaces of the condenser fins, which are cooled, for example, by means of a thermal conduction coupling to liquid-cooled cold plate 820, and more particularly, to facility coolant passing via inlet 821 and outlet 822 through the liquid-cooled cold plate. By making contact with the cool, vertically-oriented condenser fin surfaces, the dielectric fluid vapor undergoes a second phase change process from vapor to liquid state, and the liquid condensate falls back downwards due to gravity and its relatively higher density compared with the neighboring vapor region. By way of example, the vertically-oriented fins might comprise thermally conductive pin fin or plate fin structures.

Note that submerged baffle 880 in the embodiment of FIG. 8 is configured to function to partially isolate the vapor-rich region near the one or more electronic devices from the liquid (condensate) region near the outer walls of the compartment. Baffle 880 includes openings in its lower portion to allow the liquid dielectric coolant to find its own common level within the sealed compartment. As long as the boiling and condensation cooling processes are in equilibrium and are commensurate with the heat generated by the electronic device to be cooled, the electronic module will successfully transport heat from the electronic device to the cold plate.

Figure 9:
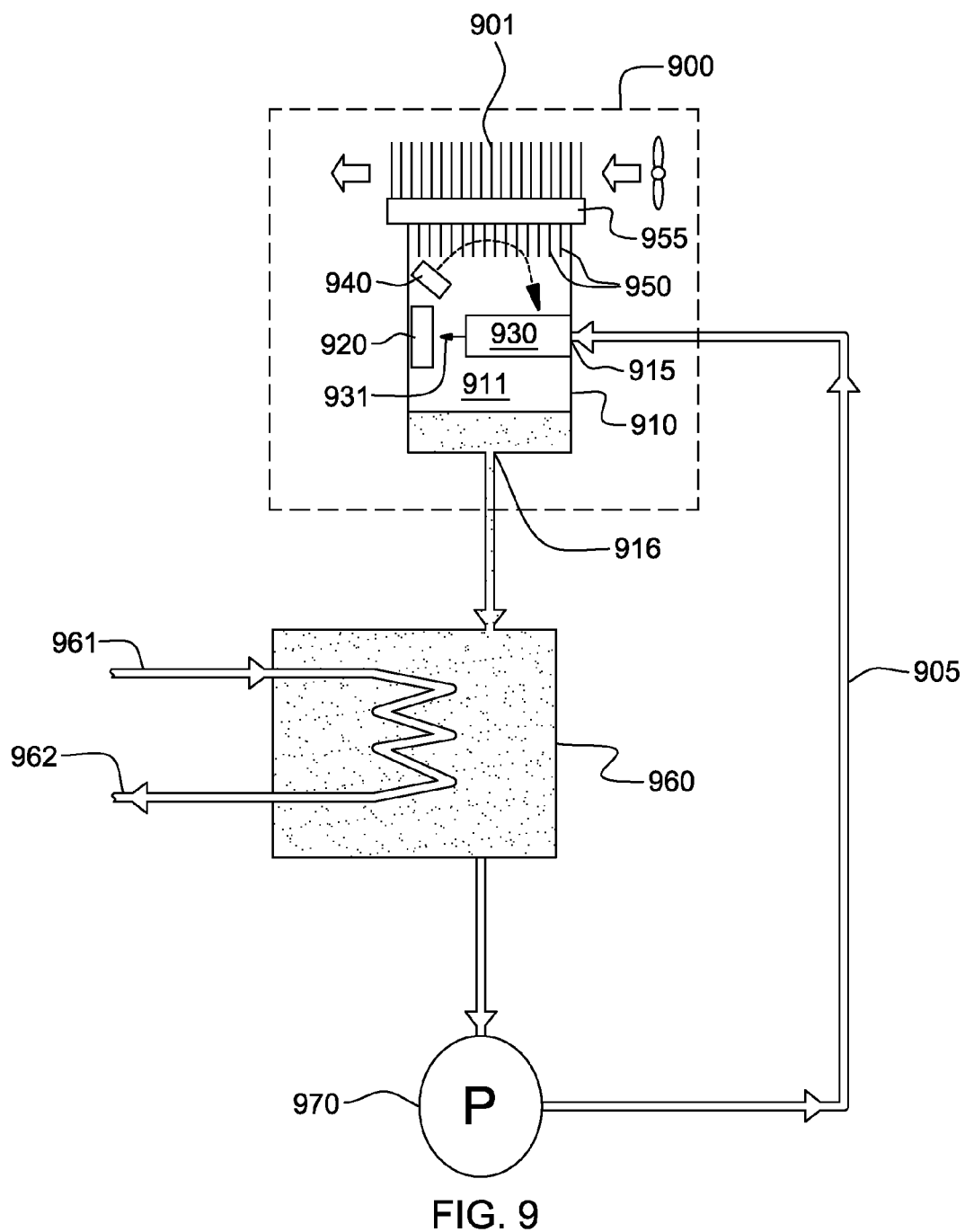
FIG. 9 is a schematic of an alternate embodiment of a cooling apparatus utilizing two-phase dielectric coolant cooling of one or more electronic devices, in accordance with an aspect of the present invention.

FIG. 9 is a schematic of an alternate embodiment of a cooling apparatus utilizing two-phase dielectric coolant cooling of one or more electronic devices. This embodiment is similar to the cooling apparatus illustrated in FIG. 5, with the exception that an air-cooled heat sink 901 within electronics system 900 is utilized to cool vapor condenser 955. As shown, vapor condenser 955 comprises a plurality of thermally conductive condenser fins 950 extending into a compartment 911 defined by a housing 910 about the one or more electronic devices 920 to be cooled. Sub-cooled liquid dielectric coolant flowing through a coolant flow path 905 is supplied through a coolant inlet 915 to spray (or jet) nozzle 930, which directs liquid dielectric coolant 931 into contact with the one or more electronic devices 920 to be cooled, as described above. One or more vapor fans 940 are disposed in this embodiment in the coolant flow path in an upper portion of the compartment to facilitate movement of dielectric coolant vapor into contact with the plurality of thermally conductive condenser fins 950 of vapor condenser 955.

As in the embodiment of FIGS. 5-7, the surface to be cooled associated with the one or more electronic devices, and the one or more electronics devices, are oriented vertically within compartment 911. Condensate liquid pools in a lower portion of the compartment for exhausting via an outlet port 916 to a sub-cooling heat exchanger 960, which sub-cools the liquid dielectric coolant before being re-circulated via coolant pump 970 back for return to spray nozzle 930. Liquid dielectric coolant is sub-cooled within sub-cooling heat exchanger 960 by a secondary coolant passing therethrough supplied via a coolant inlet line 961 and exhausted via a coolant outlet line 962. Note that in this embodiment, the electronics device and the sub-cooling heat exchanger are cooled using different coolant loops. The advantage of this loop design is that the coolant passing through sub-cooling heat exchanger 960 (e.g., water) does not need to be transported to the electronic device, or more particularly, to the housing containing the electronic device. Thus, in this embodiment, the dielectric coolant flowing through the coolant flow path may be transported to and from the electronics system 900 in a multi-system embodiment in a manner such as described above in connection with the water transport implementation of FIGS. 2-4.

Figure 10:
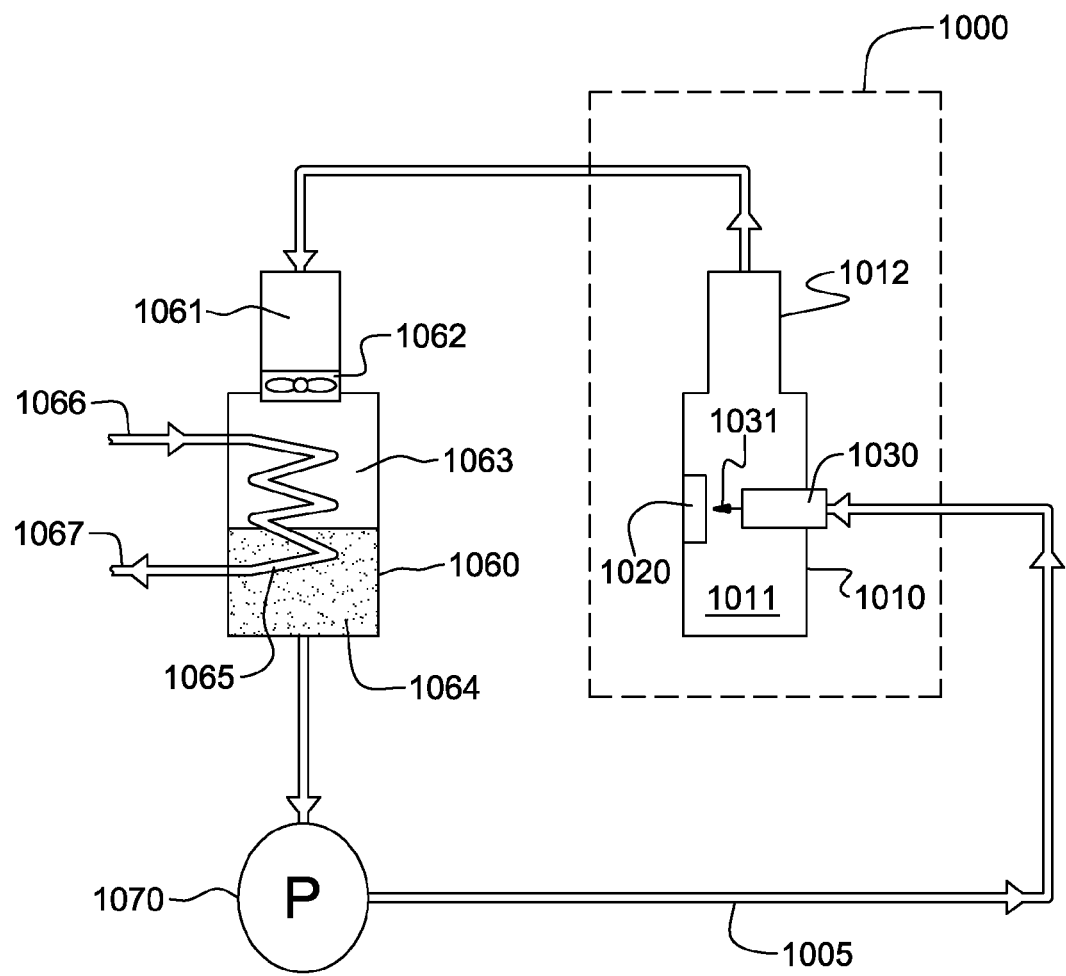
FIG. 10 is a schematic of another embodiment of a cooling apparatus utilizing two-phase dielectric coolant cooling of one or more electronic devices, in accordance with an aspect of the present invention.

FIG. 10 is a schematic of another embodiment of a cooling apparatus utilizing two-phase dielectric coolant cooling of one or more electronic devices. In this embodiment, an electronics system 1000, such as a node of the multi-node electronics rack described above in connection with FIGS. 2-4, includes a housing 1010 which defines a compartment 1011, within which one or more electronic devices 1020 are disposed for cooling. A coolant flow path 1005 is in fluid communication with housing 1010 and provides liquid dielectric coolant to a spray nozzle 1030 associated with the housing. As shown, spray nozzle 1030 directs liquid dielectric coolant 1031, for example, in the form of a spray cone, onto a surface to be cooled associated with the one or more electronic devices 1020. The one or more electronic devices 1020 are oriented vertically (in this embodiment) within compartment 1011 in order to facilitate impinging, for example, the back side of the one or more electronic devices with the spray cone to facilitate cooling thereof.

When in operation, as dielectric coolant absorbs heat, it undergoes phase change from liquid phase to vapor phase, and thus utilizes its latent heat of vaporization for cooling purposes. The resultant dielectric coolant vapor rises to the upper portion of compartment 1011, where a vapor exhaust port 1012 directs the dielectric coolant vapor to a vapor entry port 1061 of a vapor condenser and sub-cooling heat exchanger structure 1060. As illustrated, one or more vapor fans 1062 are disposed at the vapor entry port 1061 to facilitate movement of dielectric coolant vapor from compartment 1011 of housing 1010 into the vapor condenser and sub-cooling heat exchanger structure 1060. In this embodiment, the dielectric coolant vapor undergoes condensation in a condensation portion 1063 of the vapor condenser and sub-cooling heat exchanger structure 1060, and subsequently drops to a lower portion of the structure as condensate liquid where it undergoes sub-cooling in a sub-cooling portion 1064 of the structure 1060. A coolant loop 1065 passing through the vapor condenser and sub-cooling heat exchanger structure 1060 facilitates the formation of coolant condensate and the sub-cooling of the condensate liquid. A coolant, such as water, is passed through coolant loop 1065 via a coolant inlet line 1066 and a coolant outlet line 1067, to serve the dual function of vapor condensation and condensate liquid sub-cooling. One or more fins (not shown) may be provided within either the condensation portion of the structure and/or the sub-cooling portion of the structure to facilitate the condensation and sub-cooling functions. Sub-cooled liquid dielectric coolant is then re-circulated via a coolant pump 1070 through coolant flow path 1005 for return to spray nozzle 1030 to repeat the process.

The particular implementation illustrated in FIG. 10 may be advantageous where there is no room in electronics system 1000 or within housing 1010 to accommodate a vapor fan, such as described herein. Further, this implementation could be employed with a single vapor fan servicing more than one housing 1010 disposed within the same or different electronic systems 1000. That is, a single vapor fan could be drawing dielectric coolant vapor from multiple compartments of multiple housings within the same or different electronics systems.

FIGS. 11A & 11B are a schematic of one embodiment of a cooled electronics rack, generally denoted 1100, in accordance with an aspect of the present invention. Cooled electronics rack 1100 includes an electronics rack 110 having, for example, a plurality of multi-blade center systems 1101 stacked within the rack. In this example, five multi-blade center systems 1101 are illustrated, with each system being an example of an electronics system chassis. As illustrated in FIG. 11A, each multi-blade center system 1101 includes a back plane 1112, into which respective removable blades 1110 are electrically inserted, and a back space 1111, which conventionally accommodates one or more air-moving devices (not shown) to cause air flow to flow from a front side 111 to a back side 112 of electronics rack 110 through the multi-blade center system 1101.

One embodiment of a cooling apparatus, generally denoted 1115, is illustrated in FIG. 11A. In this embodiment, a liquid-cooling unit 1120 (referred to as a modular water-cooling unit (MWU)), is disposed in a lower portion of electronics rack 110. Liquid-cooling unit 1120 includes, for example, a liquid-to-liquid heat exchanger (not shown) for extracting heat from coolant flowing through a first coolant loop 1130 of liquid-cooling apparatus 1115 and dissipating heat within a facility coolant loop 1119, comprising a facility coolant supply line 1121 and facility coolant return line 1122. In one example, facility coolant supply line 1121 and facility coolant return line 1122 couple liquid-cooling unit 1120 to a data center facility coolant supply and return (not shown). Liquid-cooling unit 1120 further includes an appropriately sized reservoir, pump and optional filter, for moving liquid coolant through first coolant loop 1130. In one embodiment, first coolant loop 1130 includes a rack-level inlet manifold 1131 and a rack-level outlet manifold 1132, which are coupled to liquid-cooling unit 1120 via, for example, flexible hoses and respective quick connect couplings. The flexible hoses allow the rack-level manifolds to be mounted within, for example, a door of the electronics rack hingedly mounted to the air inlet side of the electronics rack in a manner similar to that described in co-pending, commonly assigned U.S. Pat. No. 7,450,385 B1, issued Nov. 11, 2008. In one example, rack-level inlet manifold 1131 and rack-level outlet manifold 1132 each comprise an elongate, rigid tube vertically mounted to electronics rack 110.

In the embodiment illustrated, the rack-level coolant manifold assembly, comprising rack-level inlet manifold 1131 and rack-level outlet manifold 1132, is in fluid communication with multiple, movable, chassis-level manifold sub-assemblies 1140. Various examples of movable, chassis-level manifold sub-assemblies mounted to an electronics rack are described in co-pending, commonly assigned U.S. patent application Ser. No. 12/168,259, filed Jun. 7, 2008, entitled "Liquid Cooling Apparatus and Method for Facilitating Cooling of an Electronics System". Each movable, chassis-level manifold assembly is coupled to the electronics rack to reciprocate vertically (as indicated by arrows 1102) adjacent to an associated electronics system chassis to facilitate the removal of individual blades, without impacting cooling of adjacent blades. Respective quick connect couplings may be employed to couple the rack-level inlet manifold and rack-level outlet manifold to each movable, chassis-level manifold assembly 1140 using, for example, appropriately sized, flexible rack-level tubing. The quick connect couplings may be any one of various types of commercially available couplings, such as those available from Colder Products Company, of St. Paul, Minn., U.S.A., or Parker Hannifin, of Cleveland, Ohio, U.S.A.

As partially illustrated in FIG. 11B, each movable, chassis-level manifold assembly 1140 includes a first chamber 1141 and a plurality of second chambers 1142 disposed, in this example, within a common structure, but isolated to prevent direct flow of coolant therebetween. As explained further below, the first chamber and the plurality of second chambers are isolated by a heat exchanger which facilitates transfer of heat from coolant flowing through a plurality of second coolant paths passing through the plurality of second chambers to coolant flowing through a first coolant path passing through the first chamber. Heat transferred to coolant passing through the first coolant path of each chassis-level manifold assembly is transferred via the rack-level outlet manifold 1132 and liquid cooling unit 1120 to facility coolant loop 1119. In one example, coolant passing through first coolant loop 1130, and hence, coolant passing through the first coolant paths within the movable, chassis-level manifold sub-assemblies, is water. In the example illustrated, the vertically-oriented rack-level inlet and outlet manifolds each have five ports, which connect to five horizontally-oriented, movable, chassis-level manifold assemblies 1140. The chassis-level manifold assemblies serve as a heat rejection component for the heat load removed by the individual blades 1110 of their respective multi-blade center systems 1101.

Each second chamber of the plurality of second chambers of each chassis-level manifold assembly 1140 has an outlet coupled via flexible tubing 1143 to a coolant inlet of a respective immersion-cooled blade 1110. In one embodiment, each flexible tubing 1143 couples to a respective second chamber of the chassis-level manifold assembly 1140 via an appropriate hose barb fitting 1145, and couples to the immersion-cooled blade 1110 via a quick connect coupling 1147. Further, flexible tubing 1144 couples an inlet of each second chamber of the plurality of second chambers of each chassis-level manifold assembly 1140 to a coolant outlet of the respective immersion-cooled blade 1110. At the outlet, a quick connect coupling 1148 is employed to facilitate connection or disconnection of the corresponding immersion-cooled blade, while at its other end, flexible tubing 1144 couples to chassis-level manifold assembly 1140 via an appropriate hose barb fitting 1146. Flexible tubes 1143, 1144 are sized and provided with sufficient flexibility to allow the associated movable, chassis-level manifold assembly 1140 to reciprocate within a designated extent of travel, as illustrated by arrows 1102.

As noted, in one example, a two-phase dielectric coolant is employed within immersion-cooled blade 1110 in the second chambers of the respective chassis-level manifold assemblies 1140. In operation, flexible tubing 1144 transports dielectric coolant vapor from the immersion-cooled blade 1110 to the corresponding second chamber of the chassis-level manifold assembly. The second chamber functions as a condenser, with the lower flexible tubing 1143 transporting condensed liquid coolant from the second chamber to the immersion-cooled blade 1110 for continued cooling of the immersion-cooled blade. As illustrated in FIG. 11B, a vapor fan 1155 is disposed within each second chamber 1142 to facilitate movement of dielectric coolant vapor from the respective immersion-cooled blade 1110 to a plurality of thermally conductive condenser fins 1152 extending into second chamber 1142. A vapor baffle 1156 facilitates movement of the dielectric coolant vapor through second chamber 1142 in a C-shaped direction across thermally conductive condenser fins 1152. The plurality of thermally conductive condenser fins 1152 are coupled to a plurality of thermally conductive fins 1151 extending into first chamber 1141 of chassis-level manifold assembly 1140 for transport of heat from the dielectric coolant vapor to the coolant passing through first chamber 1141. The coolant flowing through the first chamber of each chassis-level manifold assembly yields a temperature at the condenser fins in the respective second chambers of the manifold assembly that is well below the boiling point of the dielectric coolant employed in the immersion-cooled blades. As a result, the dielectric coolant vapor condenses over the surfaces of these fins. The condensed liquid may be close in temperature to the vapor, or it could be sub-cooled to a much lower temperature, based on operating conditions in the first coolant loop side of each manifold assembly's heat exchanger. Note that the use of a vapor fan within each second chamber significantly enhances the capability of the thermosyphon loop to extract vapor from the immersion-cooled blade, as well as to augment condensation heat transfer by forcing the dielectric coolant vapor into contact with the plurality of thermally conductive condenser fins extending into the respective second chambers.

Figure 12A:
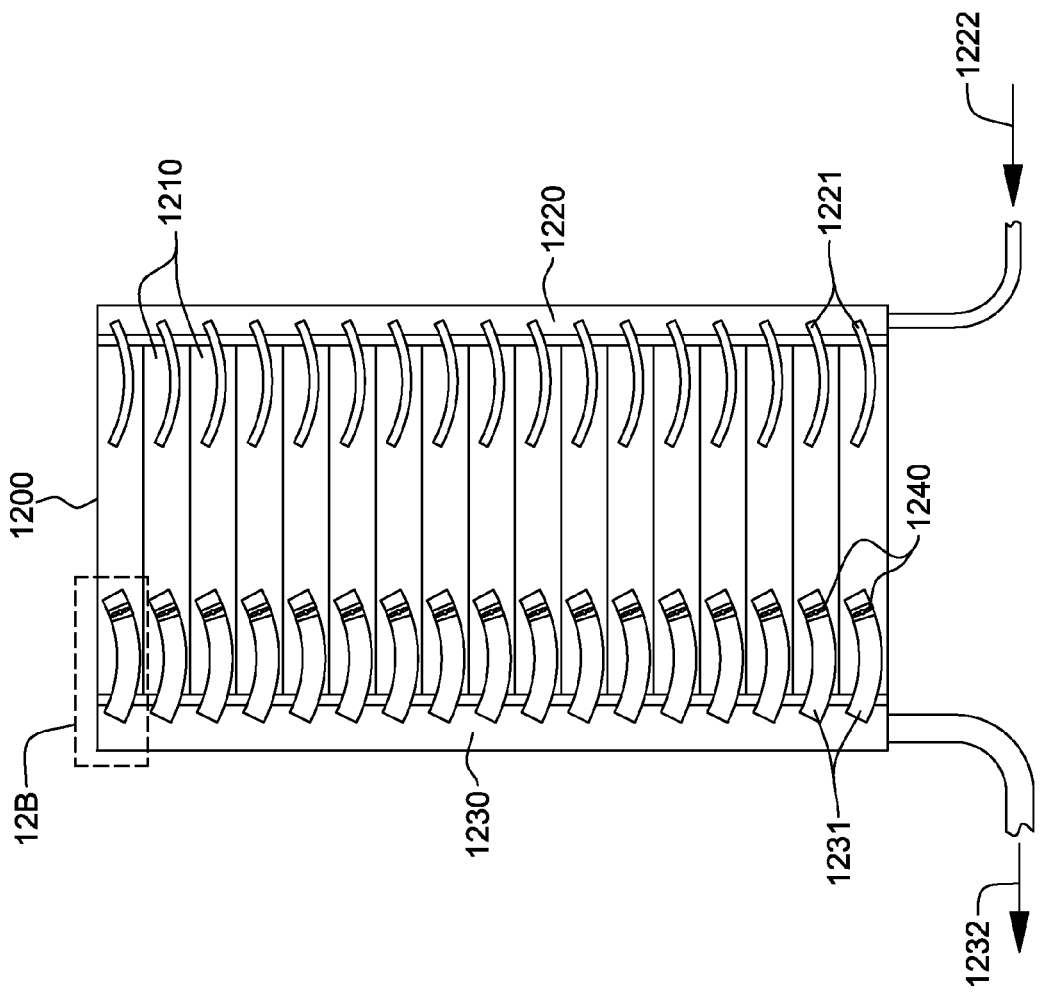
FIG. 12A is an elevational view of another embodiment of an electronics rack and cooling apparatus utilizing two-phase dielectric coolant cooling of selected electronic devices within multiple electronics subsystems of the electronics rack, in accordance with an aspect of the present invention.
Figure 12B:
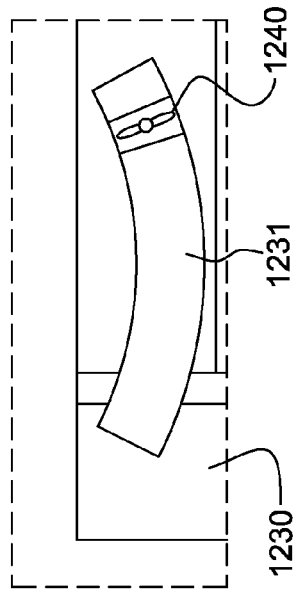
FIG. 12B is a partial enlargement of the cooling apparatus of FIG. 12A, illustrating disposition of a vapor fan within a coolant outlet hose coupling one of the electronic subsystems to the coolant outlet plenum of the cooling apparatus, in accordance with an aspect of the present invention.

FIGS. 12A & 12B depict another embodiment of an electronics rack and cooling apparatus utilizing two-phase dielectric coolant cooling of electronic devices within multiple electronics subsystems of the electronics rack. In this embodiment, liquid-cooled electronics rack 1200 includes a plurality of electronics subsystems 1210, which are (in one embodiment) server nodes. A bulk power regulator (not shown) may be disposed at an upper portion of liquid-cooled electronics rack 1200. A vertically-extending coolant inlet plenum 1220 and vertically-extending coolant outlet plenum 1230 are in fluid communication with respective coolant supply and return lines 1222, 1232, as illustrated. Additionally, coolant inlet hoses 1221 couple coolant inlet plenum 1220 to the respective electronics subsystems 1210, and coolant outlet hoses 1231 couple the individual electronics subsystems 1210 to coolant outlet plenum 1230. Within each electronics subsystem 1210, one or more electronic devices may be cooled utilizing one or more of the cooling apparatuses described above. In this embodiment, a vapor fan 1240 is disposed within the respective coolant outlet hoses 1231 that exit the electronics subsystems 1210. The electronics subsystems themselves may be completely immersed in the dielectric coolant, or the coolant inlet hoses may feed device-level cooling apparatuses which cool specific components via two-phase cooling, such as described above.

In the absence of the vapor fans illustrated in FIGS. 12A & 12B, there would be pressure build-up in the coolant outlet plenum commensurate with the pressure differential required to move a certain mass flow rate of coolant through the manifold. This pressure build-up would manifest itself as a higher pressure, and thus higher saturation temperature in the top most electronics subsystems 1210 (e.g., servers (or cold plates coupled to the servers)). This higher saturation temperature would result in a higher component temperature in the upper electronics subsystems. Thus, the inclusion of vapor fans 1240 in the coolant outlet hoses (i.e., the vapor exhaust hoses) serves to compensate for this pressure build-up, thereby allowing for lower temperature operation of the electronics subsystems in the upper portion of the liquid-cooled electronics rack.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus for facilitating cooling of one or more electronic devices, the apparatus comprising:
    a coolant flow path in fluid communication with the one or more electronic devices, the coolant flow path accommodating a liquid dielectric coolant, wherein upon contacting the one or more electronic devices, the liquid dielectric coolant in the coolant flow path vaporizes to form dielectric coolant vapor;
    a vapor condenser in fluid communication with the coolant flow path for facilitating condensate formation from the dielectric coolant vapor within the coolant flow path; and
    at least one dielectric coolant vapor fan disposed within the coolant flow path to facilitate movement of the dielectric coolant vapor into contact with the vapor condenser, and thereby facilitate cooling of the one or more electronic devices through enhanced coolant condensate formation and thus enhanced return of the dielectric coolant vapor to the liquid dielectric coolant.

2. The apparatus of claim 1, further comprising a housing configured to at least partially surround and form a compartment about the one or more electronic devices to be cooled, and wherein the vapor condenser comprises a plurality of thermally conductive condenser fins extending into the compartment in an upper portion of the compartment, the plurality of thermally conductive condenser fins facilitating cooling of dielectric coolant vapor rising to the upper portion of the compartment, and wherein the at least one vapor fan is disposed within the compartment to facilitate moving dielectric coolant vapor into contact with the plurality of thermally conductive condenser fins of the vapor condenser.

3. The apparatus of claim 2, wherein the one or more electronic devices are disposed vertically within the compartment and wherein the apparatus further comprise a spray nozzle within the coolant flow path for directing a spray cone of liquid dielectric coolant towards the one or more electronic devices to be cooled, the at least one vapor fan being disposed within the compartment above the one or more electronic devices to be cooled.

4. The apparatus of claim 3, further comprising at least one vapor vane or baffle disposed within the compartment for directing dielectric coolant vapor within the compartment towards the plurality of thermally conductive condenser fins of the vapor condenser.

5. The apparatus of claim 4, further comprising a spray cone shroud disposed within the compartment about at least a portion of the spray cone to prevent coolant condensate dropping within the compartment from the plurality of thermally conductive condenser fins from interfering with the spray cone, and wherein the plurality of thermally conductive condenser fins comprise a plurality of angled condenser fins, the plurality of angled condenser fins being angled to direct coolant condensate dropping therefrom away from the spray cone.

6. The apparatus of claim 3, further comprising a heat exchanger in fluid communication with the coolant flow path for sub-cooling the liquid dielectric coolant prior to passing through the spray nozzle, and wherein the coolant flow path is a closed-loop flow path.

7. The apparatus of claim 2, wherein the housing is configured to at least partially surround and form a sealed compartment about the one or more electronic devices to be cooled, and the coolant flow path is disposed within the sealed compartment, and wherein the apparatus further comprises a vapor baffle for directing dielectric coolant vapor within the sealed compartment towards the at least one vapor fan, and thus, towards the plurality of thermally conductive condenser fins of the vapor condenser.

8. The apparatus of claim 1, further comprising a housing configured to at least partially surround and form a compartment about the one or more electronic devices to be cooled, and a spray nozzle for directing a spray cone of liquid dielectric coolant towards the one or more electronic devices to be cooled, wherein the one or more electronic devices to be cooled are disposed vertically within the compartment, the vapor condenser is disposed separate from the housing, and the at least one vapor fan is associated with the vapor condenser, separate from the housing, the at least one vapor fan facilitating flow of dielectric coolant vapor from an upper portion of the compartment containing the one or more electronic devices to the vapor condenser.

9. The apparatus of claim 1, further comprising:
    a container sized to receive an electronics system therein, the electronics system comprising the one or more electronic devices to be cooled;
    a coolant inlet port and a coolant outlet port associated with the container for facilitating ingress and egress of dielectric coolant through the container, wherein when the electronics system is operatively positioned within the container and dielectric coolant flows therethrough, the one or more electronic devices of the electronics system are immersion-cooled by the dielectric coolant; and
    wherein the vapor condenser is disposed external to the container, and the at least one vapor fan is associated with the vapor condenser external to the container for facilitating flow of dielectric coolant vapor from the container to the vapor condenser.

10. The apparatus of claim 1, further comprising a coolant inlet plenum and a coolant outlet plenum in fluid communication with the coolant flow path, and wherein the at least one vapor fan is disposed within the coolant flow path between the one or more electronic devices and the coolant outlet plenum, the coolant outlet plenum facilitating passage of dielectric coolant vapor to the vapor condenser, and the vapor condenser being disposed separate from the one or more electronic devices to be cooled.

11. A cooled electronic device comprising:
a substrate;
at least one electronic device coupled to the substrate; and
a cooling apparatus for cooling the at least one electronic device, the cooling apparatus comprising:
    a coolant flow path in fluid communication with the at least one electronic device, the coolant flow path accommodating a liquid dielectric coolant, wherein upon contacting a surface to be cooled associated with the at least one electronic device, the liquid dielectric coolant in the coolant flow path vaporizes to form dielectric coolant vapor, thereby facilitating cooling of the surface to be cooled;
    a vapor condenser in fluid communication with the coolant flow path for facilitating coolant condensate formation from the dielectric coolant vapor within the coolant flow path; and
    at least one dielectric coolant vapor fan disposed within the coolant flow path to facilitate movement of dielectric coolant vapor into contact with the vapor condenser, and thereby facilitate cooling of the surface to be cooled associated with the at least one electronic device through enhanced coolant condensate formation and thus enhanced return of the dielectric coolant vapor to the liquid dielectric coolant.

12. The cooled electronic device of claim 11, wherein the surface to be cooled associated with the at least one electronic device comprises one of a surface of the at least one electronic device or a thermally conductive surface coupled to the at least one electronic device, and wherein coolant flows through the coolant flow path in a coolant flow direction, and the at least one vapor fan is disposed within the coolant flow path downstream from the surface to be cooled.

13. The cooled electronic device of claim 12, wherein the at least one vapor fan is disposed within the coolant flow path between the surface to be cooled and the vapor condenser for facilitating movement of dielectric coolant vapor into contact with the vapor condenser and thus for facilitating coolant condensate formation.

14. The cooled electronic device of claim 11, further comprising a housing configured to at least partially surround and form a compartment about the surface to be cooled associated with the at least one electronic device, and wherein the vapor condenser comprises a plurality of thermally conductive condenser fins extending into the compartment in an upper portion of the compartment, the plurality of thermally conductive condenser fins facilitating cooling of dielectric coolant vapor rising to the upper portion of the compartment, and wherein the at least one vapor fan is disposed within the compartment to facilitate moving dielectric coolant vapor into contact with the plurality of thermally conductive condenser fins of the vapor condenser, and wherein the at least one electronic device is disposed vertically in the compartment and the cooling apparatus further comprises a spray nozzle within the coolant flow path for directing a spray cone of liquid dielectric coolant towards the surface to be cooled, the at least one vapor fan being disposed within the compartment above the at least one electronic device.

15. The cooled electronic device of claim 14, further comprising a spray cone shroud disposed within the compartment about at least a portion of the spray cone to prevent liquid coolant condensate dropping within the compartment from the plurality of thermally conductive condenser fins from interfering with the spray cone, and wherein the plurality of thermally conductive condenser fins comprise a plurality of angled condenser fins, the plurality of angled condenser fins being angled to direct liquid coolant condensate dropping therefrom away from the spray cone.

16. The cooled electronic device of claim 11, further comprising a housing configured to at least partially surround and form a sealed compartment about the at least one electronic device, and wherein the coolant flow path is disposed within the sealed compartment, and the cooling apparatus further comprises a vapor baffle for directing dielectric coolant vapor within the sealed compartment towards the at least one vapor fan, and thus, towards the plurality of thermally conductive condenser fins of the vapor condenser.

17. The cooled electronic device of claim 11, wherein the cooling apparatus further comprises a housing configured to at least partially surround and form a compartment about the at least one electronic device to be cooled, and a spray nozzle for directing a spray cone of liquid dielectric coolant towards the surface to be cooled associated with the at least one electronic device, wherein the surface to be cooled is disposed vertically within the compartment, the vapor condenser is disposed external to the housing, and the at least one vapor fan is associated with the vapor condenser, external to the housing, the at least one vapor fan facilitating flow of dielectric coolant vapor from an upper portion of the compartment to the vapor condenser disposed external to the housing.

18. The cooled electronic device of claim 11, wherein the cooling apparatus further comprises:
    a container sized to receive an electronics system therein, the electronics system comprising the at least one electronic device;
    a coolant inlet port and a coolant outlet port associated with the container for facilitating ingress and egress of dielectric coolant through the container, wherein when the electronics system is operatively positioned within the container and the dielectric coolant flows therethrough, the at least one electronic device of the electronics system is immersion-cooled by the dielectric coolant; and
    wherein the vapor condenser is disposed external to the container, and the at least one vapor fan is associated with the vapor condenser external to the container for facilitating flow of dielectric coolant vapor from the container to the vapor condenser.

19. The cooled electronic device of claim 11, wherein the cooling apparatus further comprises a coolant inlet plenum and a coolant outlet plenum in fluid communication with the coolant flow path, wherein the at least one vapor fan is disposed within the coolant flow path between the at least one electronic device and the coolant outlet plenum, the coolant outlet plenum facilitating passage of dielectric coolant vapor to the vapor condenser, the vapor condenser being disposed separate from the at least one electronic device to be cooled.

20. A method of facilitating cooling of an electronic device, the method comprising:
    providing a liquid dielectric coolant in contact with the electronic device during operation thereof, wherein the liquid dielectric coolant vaporizes to form dielectric coolant vapor, thereby facilitating cooling of the electronic device;
    providing a vapor condenser in fluid communication with a coolant flow path accommodating the liquid dielectric coolant for facilitating coolant condensate formation from the dielectric coolant vapor within the coolant flow path; and utilizing at least one dielectric coolant vapor fan disposed within the coolant flow path to actively move the dielectric coolant vapor into contact with the vapor condenser, and thereby facilitate cooling of the electronic device by facilitating coolant condensate formation, and thus return of the dielectric coolant vapor to the liquid dielectric coolant within the coolant flow path.

* * * * *